United States Patent [19]

Shirai et al.

[11] 4,326,213

[45] Apr. 20, 1982

[54] SEMICONDUCTOR DEVICE AND PROCESS FOR PRODUCING THE SAME

[75] Inventors: Kazunari Shirai; Izumi Tanaka, both of Yokohama, Japan

[73] Assignee: Fujitsu Limited, Kawasaki, Japan

[21] Appl. No.: 964,514

[22] Filed: Nov. 29, 1978

[51] Int. Cl.³ .......... H01L 27/02

[52] U.S. Cl. .......... 357/51; 357/23; 357/41; 357/42; 357/45; 357/55; 357/59

[58] Field of Search .......... 357/23, 51, 59, 41, 357/42, 45, 55

[56] References Cited

U.S. PATENT DOCUMENTS 4,110,776 8/1978 Rao et al. .......... 357/51

4,209,716 6/1980 Raymond .......... 357/23

*Primary Examiner*—Edward J. Wojciechowicz

*Attorney, Agent, or Firm*—Staas & Halsey

[57] ABSTRACT

A polycrystalline silicon is used for a resistor element of a semiconductor device instead of a conventional, diffused resistor or a channel resistor, in which the channel resistance of an MOS transistor is utilized as the resistor. The length of a polycrystalline silicon layer for the resistor element is predetermined by the other polycrystalline silicon layer, formed above the resistor element. The structure of the semiconductor device according to the present invention is suited for a high density integrated circuit.

7 Claims, 10 Drawing Figures

SEMICONDUCTOR DEVICE AND PROCESS FOR PRODUCING THE SAME

BACKGROUND OF THE INVENTION

1. Field of the Invention:

The present invention relates to a semiconductor device, as well as to the process for producing that semiconductor device.

2. Description of the Prior Art:

A semiconductor device of integrated type is referred to as a semiconductor integrated circuit (I.C.), wherein all of the circuit elements, i.e. such active elements as a bipolar transistor or a unipolar transistor, typically an MOS (metal-oxide-semiconductor) transistor, and such passive elements as a diffused resistor or capacitor, are formed on the surface of a semiconductor substrate. Since it is necessary to enhance the integration degree of the circuit elements, so as to produce the semiconductor integrated circuit at low cost, attempts have been made, in the formation of the circuit elements on the semiconductor substrate, to reduce the surface area of the circuit elements as small as possible. In addition, various arrangements of the circuit elements suited for a high density integrated circuit have been devised, in accordance with the kinds of the integrated circuit, by experts in the art. Furthermore, the kinds of the circuit elements suited for the high density integrated circuit are carefully selected. For example, in a static random-access memory, in which flip-flop circuits were constituted by means of MOS transistors, the all-transistor type memory cell was conventionally produced by utilizing the channel resistance of the MOS transistors for a resistance load of the memory cell, so that the integration degree of the random-access memory could be enhanced. Since the conventional diffused resistor had to be rather long, the channel resistance was used instead of the diffused resistor. However, in accordance with a recent development in the semiconductor industry, polycrystalline silicon layers having a high resistance can be reliably formed by a chemical vapor growth technique, so that layers having constant resistance can be repeatedly reproduced.

Research by the present inventors directed to replacing the MOS transistor used for the load of the memory cell with a resistor element made from the polycrystalline silicon having a high resistance, indicates the following requirements. Namely, the resistor element(s) must be isolated from the other elements and the wiring connecting various circuit elements of the memory cell, without reducing the integration degree thereof, while the resistor element(s) must be easily formed and precisely adjusted to a predetermined resistance value in the production of the memory cell.

SUMMARY OF THE INVENTION

It is, therefore, an object of the present invention to provide in a semiconductor device having an integrated resistor element(s) an improved structure of a semiconductor device suited for high density integrated circuits.

It is another object of the present invention to provide a semiconductor device wherein the circuit elements can be made in a fine circuit pattern by means of laying the wiring of the semiconductor device over the resistor element(s), or vice versa.

It is a further object of the present invention to provide a process for producing a semiconductor device having a structure suited for a high density integrated circuit.

It is also an object of the present invention to provide a process for producing a semiconductor device, in which process a resistor element(s) having a high resistance and an insulated gate FET(s) (field effect transistor) can easily be produced.

It is still another object of the present invention to provide a process for producing a semiconductor device, according to which process an extremely thin insulating film can be used for insulation between the high resistance-resistor element(s) and the wiring.

The basic concept of the present invention resides in the fact that the length of a polycrystalline semiconductor layer for a resistor element(s) of the semiconductor device is predetermined by the other polycrystalline semiconductor layer(s) formed above the resistor element(s). An intermediate insulating layer is formed between the two polycrystalline layers, for purposes explained hereinbelow.

In accordance with the present invention, there is provided a semiconductor device comprising:

a semiconductor substrate provided with at least one active element;

a first insulating film, which covers a portion of the semiconductor substrate;

at least one resistor element, comprising a first polycrystalline semiconductor material layer extending in a predetermined direction and which is formed on the first insulating film;

a second insulating film, which covers said at least one resistor element; and at least one, second polycrystalline semiconductor material layer, which extends in said predetermined direction and which is formed on the second insulating film in such a manner that each of the resistor elements is positioned below each of the second polycrystalline semiconductor material layers.

When the second polycrystalline material layer is used as a conductor, for electrically connecting the resistor element(s) with other predetermined elements of said semiconductor device, it is possible to produce a semiconductor device with a high circuit density. It is preferable, to bring the terminal portions of the resistor element(s) into contact with the conductor mentioned above, via a highly conductive region.

A process for producing a semiconductor device according to the present invention comprises the steps of:

forming a first insulating layer on a portion of the surface of a semiconductor substrate forming a first semiconductor material layer having a high resistance on the first insulating film;

selectively removing the first semiconductor material layer and thus forming at least one resistor element and a first conductor "wire" pattern, which connects the resistor element(s) with a first predetermined element of the semiconductor device;

selectively forming a second insulating film, which covers said at least one resistor element and which exposes the terminals of said at least one resistor element;

forming a second semiconductor material layer, on the second insulating layer, which second semiconductor material layer is polycrystalline and has a second conductor "wire" pattern for connecting said at least one resistor element with a second predetermined element of the semiconductor device, and portions of the second semiconductcr material layer ovelapping to the terminals of said at least one resistor element;

selectively removing exposed portions of the second insulating layer using the second conductor wire pattern as a mask, thereby exposing said first conductor wire pattern and leaving the second insulating layer under the second conductor wire pattern; and introducing an impurity into the first and second semiconductor material layers having the first and second conductor wire patterns, respectively, and providing these layers with an electrical conductivity.

Another process according to the present invention is directed to a process for producing a semiconductor device comprising a semiconductor silicon substrate and at least one insulated gate semiconductor FET element on regions of the surface of the semiconductor silicon substrate. This process comprises the following steps:

forming a film for preventing an oxidation of a first region encompassing portions of the semiconductor material substrate, on which portions said at least one insulated gate semiconductor FET element is to be formed;

forming a relatively thick oxide film on the remaining second region of the semiconductor silicon substrate;

forming on the relatively thick oxide film a first polycrystalline silicon layer and, then, selectively removing the first polycrystalline silicon layer, except for portions thereof to be used as at least one resistor element and a first conductor wire for electrically connecting the resistor element with a first predetermined element of the semiconductor device;

oxidizing the first polycrystalline silicon layer, while the oxidation preventing film remains on the first region, and thereby forming on the first polycrystalline silicon layer a relatively thin oxide film;

removing the oxidation preventing film and, subsequently, forming a gate oxide film having a predetermined thickness on the first region;

removing a portion of the gate oxide film and of the relatively thin oxide film, thereby exposing a portion of the semiconductor silicon substrate and of the first polycrystalline silicon layer;

selectively forming a second polycrystalline silicon layer on the relatively thin oxidation film, the exposed portion of the first polycrystalline silicon layer and the exposed portion of the substrate, in such a manner that the second polycrystalline silicon layer is extended on the relatively thin oxide film to a length required for the length of the at least one resistor element, and further, that the second polycrystalline layer has a second conductor wire pattern for electrically connecting the resistor element and the exposed portion of the substrate with a second predetermined element of the semiconductor device;

simultaneously with the step of selectively forming the second polycrystalline silicon layer, forming from the second polycrystalline silicon layer a gate of the gate oxide film on at least a portion of the gate oxide film;

removing (a) the relatively thin oxidation film except under the second conductor wire patten and (b) the portion of the gate oxide film except under the second polycrystalline silicon layer; and introducing an impurity into an exposed portion of the semiconductor silicon substrate, and the exposed first and second polycrystalline silicon layers.

BRIEF DESCRIPTION OF THE DRAWINGS

Embodiments of the present invention will be explained hereinafter in connection with the drawings, wherein.

DETAILED DESCRIPTION OF THE PREFERRED EMBODIMENTS

Figure 1:
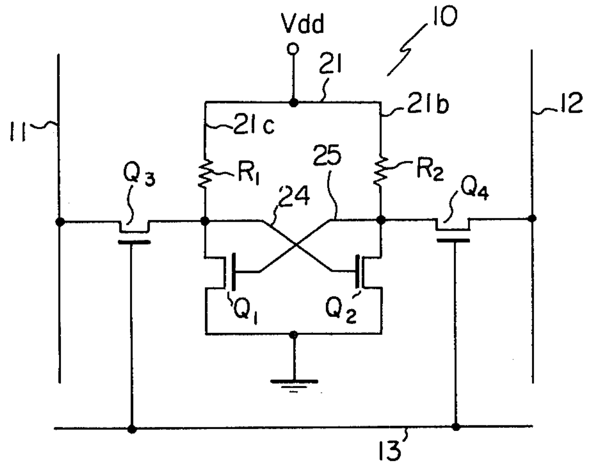
FIG. 1 is a schematic drawing of a circuit of a four transistor memory cell produced according to an embodiment of the present invention.

Referring to FIG. 1, the four transistor memory cell 10 is provided at a part of the random access memory semiconductor-device, where a pair of the bit lines 11 and 12 and one of the word lines 13 intersect with one another. The four transistor memory cell 10 includes a pair of the insulated gate FET transistors (hereinafter abbreviated as transistors) $Q_1$ and $Q_2$ for storing information, wherein the gate of each one of the transisors $Q_1$ and $Q_2$ is connected to the drain terminal of the other transistor, so that a flip-flop is formed. The resistor elements $R_1$ and $R_2$, used as load resistors of the transistors $Q_1$ and $Q_2$, respectively, are advantageously produced from a polycrystalline semiconductor material layer having a high resistance, i.e. the first polycrystalline semiconductor material layer according to the present invention. The elements of the four transistor memory cell 10 denoted as $Q_3$ and $Q_4$ are transistors, with their gates controlled by a voltage applied thereto through the word line 13. The transistors $Q_3$ and $Q_4$ connect the drain terminals of the transistor $Q_1$ and $Q_2$ to the bit lines 11 and 12, respectively.

The four transistor memory cell 10 is a memory device, which is modified from a conventional six transistor memory cell, and a plurality of these cells 10 are arranged on the semiconductor substrate in a matrix form. Although not shown in FIG. 1, a decoder circuit is formed on the substrate in order to allow selection of a group of the word lines 13 and a group of the bit lines 11 and 12. A presensing amplifier (not shown) is connected between the bit lines 11 and 12 of each bit line pair. When the decoder circuit selects the pair of bit lines 11 and 12 as well as the word line 13 for reading out and writing in the information, the electric potential of each drain terminal of a pair of the transistors $Q_1$ and $Q_2$ is transmitted to the bit lines 11 and 12, respectively, through the transistors $Q_3$ and $Q_4$ driven by the selecting signals on the word line 13. The electric potential difference between the lines 11 and 12, which represent the information "1" or "0", is increased by the presensing amplifier in such a manner that the detected information is maintained. The amplified difference mentioned above is read out by a sensing amplifier at the output stage of the random access memory.

Figure 2:
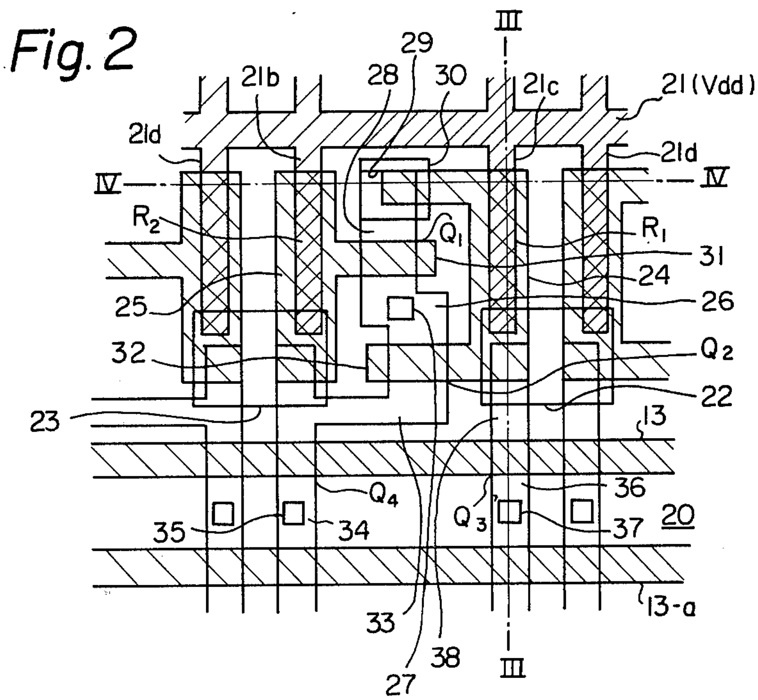
FIG. 2 is a plan view of a random access memory manufactured from the memory cell of FIG. 1.

Referring to FIG. 2, in which a plan pattern of circuit elements of a random access memory is shown, it will be understood that a pattern having a high density is achieved in accordance with the present invention. The parts 20 of FIG. 2, which are non-hatched, corresponds to a relatively thick field oxidation film, which is formed on several regions of a semiconductor substrate. The parts 21, of FIG. 2, which are hatched upward to the right, correspond to the electric bus line Vdd (FIG. 1) of the random access memory, which line consists of the first polycrystalline silicon layer of the present invention. The bus line Vdd includes vertically extending wires 21*a*, 21*b*, 21*c* and 21*d*. An adjacent pair 21*b* and 21*c* of these wires constitutes the conductors which are, in turn, connected to the resistor elements of one memory cell 10 (FIG. 1). Namely, the doping amount of the resistor elements is adjusted, in such a manner that these resistor elements exhibit the high resistance value required for the resistor elements $R_1$ and $R_2$, respectively, and the resistor elements are covered by a thin oxide film (not shown in FIG. 2). The thickness of this oxide film can be relatively small according to a feature of the present invention, as explained in detail hereinbelow. This oxide film exposes the tip end of the first polycrystalline layer. Such tip end is contiguous to the resistor elements $R_1$ and $R_2$ and connects each of these elements to an element of the semiconductor device. The resistor elements $R_1$ and $R_2$, the tip ends mentioned above, the conducting wires 21*b*, 21*c* and the bus line Vdd, as mentioned above, are integrally formed from a polycrystalline silicon semiconductor. However, as mentioned above the doping amount of an impurity in the resistor elements $R_1$ and $R_2$ is adjusted to a lower level than in the other part of the polycrystalline silicon semiconductor. Windows 22 and 23 are formed in the field insulating film 20 and expose the tip end parts of the first polycrystalline layer. The resistor elements $R_1$ and $R_2$ extend to the windows 22 and 23, respectively, and are connected by the tip end parts of the first polycrystalline layer to the transistors $Q_1$ and $Q_2$, respectively. Such tip ends parts are hereinafter simply referred to as the tip ends of the resistor element(s).

The parts 24 and 25 of FIG. 2, hatched upward to the left, correspond to a plurality of second polycrystalline silicon layers and are connected to the exposed portion of resistor elements $R_1$ and $R_2$, respectively, which are extended into the windows 22 and 23. The second polycrystalline silicon layer 24 is used as a conductor wire for connecting the gate of the transistor $Q_2$ (FIGS. 1 and 2) to the drain of the transistor $Q_1$ and is positioned above the underlying resistor element $R_1$. A thin oxidation film, i.e. a silicon dioxide film (not shown in FIG. 2), electrically insulates the second polycrystalline silicon layer 24 from the resistor element $R_1$, at an overlapping portion of this layer 24 and the resistor element $R_1$. It is to be noted that, because of this overlapping and insulated structure of the polycrystalline layer 24 and the resistor element $R_1$, the surface area of the memory cell 10 is advantageously reduced. As is apparent from FIG. 2, the same overlapping and insulated structure as mentioned above is formed in the memory cell with regard to the resistor element $R_2$ and the conductor wire 25, which are made from the second polycrystalline silicon semiconductor.

The parts 26 through 33 of FIG. 2 indicate various parts of the memory cell 10, for producing the circuits of the transistors $Q_1$ and $Q_2$. The conductor wires 24 and 25 are provided with an advantageous form for reducing the size of the memory cell 10. Namely, one of the conductor wires 24 and 25, for example the conductor wire 25 made from the second polycrystalline silicon layer, has an essentially symmetrical convex shape, such as a T shape. The protruding part of the T shaped conductor wire 25 includes a gate electrode 31 of the transistor $Q_1$. The remaining part of the T shaped conductor wire 25, i.e. the base part thereof, covers the underlying resistor element $R_2$ and electrically connects the gate electrode 31 of the transistor $Q_1$ to the drain 33 of the transistor $Q_2$. The other conductor wire 24 made from the second polycrystalline silicon layer has an esstentially symmetrical concave shape, such as a U shape. The base part of the conductor wire 24, i.e. a body part thereof from which two remaining parts protrude, covers the underlying resistor element $R_1$. One of the protruding parts of the conductor wire 24 includes a gate electrode 32 of the transistor $Q_2$, while the other protruding part includes the drain electrode of the drain 28 of the transistor $Q_1$.

The insulated gate semiconductor FET transistor $Q_1$ and $Q_2$, for example MOS transistors, have their elements arranged in the same direction as that of the resistor elements $R_1$ and $R_2$. Since the MOS transistors $Q_1$ and $Q_2$ (FIG. 1) are commonly grounded at their source, these transistors $Q_1$ and $Q_2$ possess a single, source region 26. It is well known that such a source region can be produced by a diffusion or ion implantation method. A contact window 27 is formed through the field oxidation film 20, so as to expose a portion of the source region 26 and to bring the exposed source region into contact with a not shown ground line, which extends vertically. A wide window 30 is formed through the field oxidation film 20, so as to expose the drain 28 including an end 29 thereof. The end of conductor wire 24 is brought into contact with the exposed drain 28. The gate 31 of the transistor $Q_1$ is established below the protruding part of the T-shaped conductor wire 31. The gate 32 of the transistor $Q_2$ is established by means of the conductor wire 24 having the U shape. One of the protruding parts of the U shape is used as the gate electrode for applying an electric potential to the substrate through a gate oxide film (not shown). Since the conductor wire 24 has a concave shape, such as a U shape, and further, since the conductor wire 25 has a convex form, such as a T-shape, both conductor wires 24 and 25 can be arranged in such a manner that the protruding part of the conductor wire 25 enters into the concave space defined by the concave shaped-conductor wire 24. Such arrangement of the conductor wires contributes to a reduction of the memory cell area.

The semiconductor device having the circuit illustrated in FIG. 1 can be further reduced in size when the transistors $Q_3$ and $Q_4$ are arranged in the device as follows. Since one of the source or drain regions of the transistor $Q_4$ is common with the drain region of $Q_2$, a single region 33 for these common regions is formed on the surface of the semiconductor substrate. The single region 33 extends on the semiconductor substrate to the window 23, and is brought into contact with the conductor wire 25. Namely, due to the overlapping structure of the conductor wire 25 on the region 33, such contact is realized. The other one of the source and drain regions of the transistor $Q_4$ 34 is formed on the semiconductor substrate, partly exposed by the window 35, and is electrically connected through the window 35 with a vertically extending, bit line 12 (not shown in FIG. 2).

One of the source or drain regions of the transistor $Q_3$ "38" extends on the semiconductor substrate into the window 22, which partly exposes the region 38. Due to the overlapping structure of the conductor wire 24 of the region 38, the conductor wire 24 and the region 38 are electrically connected to one another. The other of the source and drain regions of the transistor $Q_3$ 36 is partly exposed by the window 37 and is electrically connected to a vertically extending bit line 11 (not shown in FIG. 2).

A memory cell is contiguous with the memory cell 10 comprising the transistors $Q_1$ and $Q_2$ shown in FIG. 1, and the two memory cells are positioned symmetrically on the semiconductor substrate with respect to a line passing across the windows 35 and 37. The contiguous memory cell mentioned above and not shown FIG. 2 includes the insulated gate transistors which are the same kind as that of the transistors $Q_3$ and $Q_4$. The regions 34 and 36 of the transistors $Q_3$ and $Q_4$, respectively, are common with one of the source and drain regions of the insulated gate transistors, of the contiguous memory cell as mentioned above.

The horizontally extending conductor wire 13 is used for the word line and for the gate electrode of the transistors $Q_3$ and $Q_4$. The conductor wire 13-a is lower than the conductor wire 13 and is the word line of the contiguous memory cell mentioned above.

As will be explained in detail hereinbelow, the conductor wires 24 and 25 made from the second polycrystalline silicon layers can be produced simultaneously with the conductor wire 13 for the word line and the gate electrodes of the transistors $Q_1$ and $Q_2$. A polycrystalline silicon material, which is originally highly doped, may be used for the conductor wires 13, 24 and 25, although such polycrystalline silicon material cannot be used for the first polycrystalline silicon layer.

Figure 3:
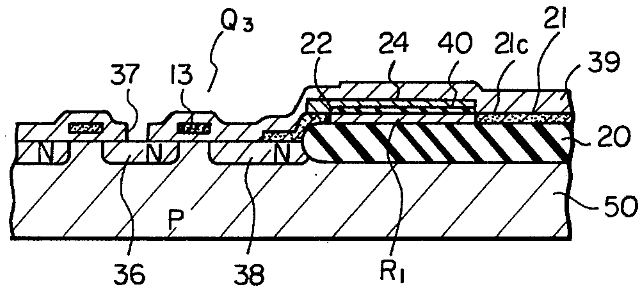
FIG. 3 is a cross sectional view of FIG. 2 along the line III—III in FIG. 2.
Figure 4:
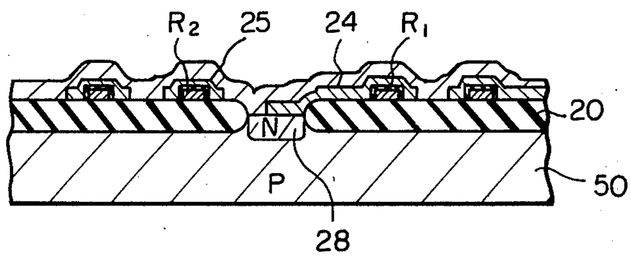
FIG. 4 is a cross sectional view of FIG. 2 along the line IV—IV in FIG. 2.

Referring to FIGS. 3 and 4, a thick field oxidation film 20 is formed by a well known selective oxidation method on a portion of the P or N type silicon substrate. On the field oxidation film 20 the first polycrystalline silicon layer is formed by a known chemical vapor growth method. When an impurity is not doped into the first polycrystalline silicon layers during the chemical vapor growth, the entire layer exhibits a high resistance, generally a sheet resistivity of several thousands of $M\Omega/\square$. The well known ion implantation method is preferably applied to adjust the resistivity precisely. The resistor element $R_1$ is made of a portion of the first polycrystalline silicon layer covered by the oxidation film 40. Namely, the resistance value required for the resistor element $R_1$ may be provided by the length of the oxidation film 40. When the oxidation film 40 is partly removed, the partial removal is conducted in such a manner that the window 22 (FIGS. 2 and 3) is formed, and further, the resistance value of the resistor element $R_1$ is adjusted by the remaining length thereof. The edge of the oxidation film 40 shown in FIG. 3 one end of the window 22. The chemical vapor growth of the second, polycrystalline silicon layer is conducted by doping a high concentration of an impurity into the growing polycrystalline silicon and, then, the so formed second polycrystalline silicon layer is selectively removed to leave patterns of the conductor wires 24, 25 and 13, i.e. the conductor wires for the gate electrode and word line mentioned above. As seen in FIG. 3, the conductor wire 24 is brought into contact with the tip end of the resistor element $R_1$ and the silicon substrate 50.

A diffusion or ion implantation method is employed after forming the oxidation film 40 as shown in FIG. 3, so as to provide all of the sources and drains of the transistors $Q_1$, $Q_2$, $Q_3$ and $Q_4$. In addition, conductor wire 21 and the exposed tip end of the resistor element $R_1$ are provided with a high electric conductivity by the diffusion or ion implantation method. An impurity having an opposite conductivity to the conductivity of the substrate is introduced into the drain 28 of the transistor $Q_1$, the source (36 or 38) and drain (38 or 36) of the transistor $Q_3$, the bus line 21, the wire for connecting the bus line 21 to the resistor element $R_1$, the exposed tip end of the resistor element $R_1$, as well as the sources and drains of the transistors $Q_3$ and $Q_4$, not shown in FIGS. 3 and 4. These elements of the memory cell are thus provided with a desired low resistance.

A surface protection layer 39, not shown in FIG. 2, may consist of a phosphosilicate glass layer which is deposited on the top surface of the silicon substrate provided with several elements of the memory cell. The surface protection layer 39 serves as an insulating means between the underlying and overlying layers. The windows 27 (not shown in FIGS. 3 and 4) and 37 are formed through the surface protecting layer 39.

It is to be noted that the electric connection between the resistor element $R_1$ and region 38 of one of the source and drain-regions of the transistor $Q_3$ is achieved not by direct connection between the N type region 38 and the resistor element $R_1$, but indirectly through the conductor wire 24 of the second polycrystalline silicon layer.

Referring to FIGS. 5 through 10, the semiconductor substrate 50 is shown in a cross sectional view in the same crossing direction as in FIG. 3.

Figure 5:
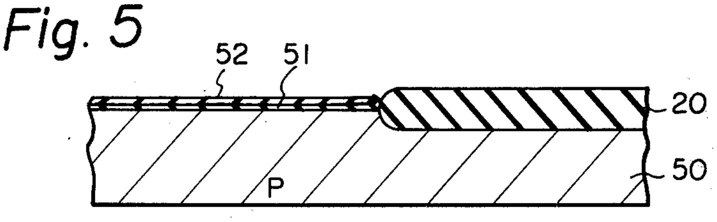
FIG. 5 is a cross sectional view of the semiconductor substrate, (hereinafter referred to as the cross sectional view) which is subjected to a selective oxidation according to an embodiment of the process of the present invention.

In FIG. 5, a P type silicon substrate 50, which is already prepared and exhibits a predetermined resistivity ranging from 1 to 50 ohm cm, is subjected to a thermal oxidation, thereby forming the silicon dioxide film 51 having a thickness of from 100 to 1000 angstroms, on the entire surface of the P type silicon substrate 50. Subsequently, the silicon nitride layer 52 is deposited on the silicon dioxide layer 51 by the chemical vapor phase reaction of monosilane with ammonia. The silicon nitride layer should have a thickness of from 300 to 2000 angstroms. The two layers 51 and 52 are selectively removed by a photoetching method, so as to leave a part of these layers for protecting or masking the first region of the P type silicon substrate 50, i.e. the active regions thereof for forming the source and drain of the transistor, as well as intermediate regions between these active regions.

The portion of the P type silicon substrate 50 not covered by the oxidation protecting films 51 and 52, is subjected to a selective oxidation, thereby forming a relatively thick field oxide film 20 having a thickness of from 5000 to 10000 angstroms. The portion mentioned above is referred to in the claims as the second region of the silicon substrate.

Figure 6:
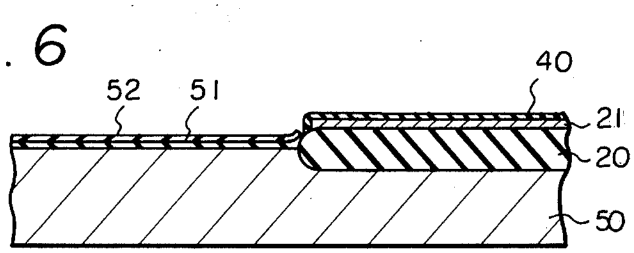
FIG. 6 is the cross sectional view, wherein a first polycrystalline silicon layer having a high resistance is formed on the oxidation film of FIG. 5, and is subjected to a surface oxidation to form a film.

Referring to FIG. 6, the polycrystalline silicon layer 21 is deposited by the decomposition of monosilane and selectively left on the field oxidation film 20 by a photo etching technique. The polycrystalline silicon layer 21, i.e. the first polycrystalline silicon layer, preferably has a thickness of from 1000 to 5000 angstroms. The sheet resistivity of the first polycrystalline layer 21 directly after the deposition amounts to several thousands MΩ/□. In order to reduce or adjust the sheet resistivity to a value ranging from several KΩ/□ to several MΩ/□, ions of arsenic of phosphorus may be ion-implanted into the first polycrystalline silicon layer 21 after or before the photo-etching of the layer 21. Such ions are implanted at a trace concentration of from $10^{12}$ to $10^{13}/cm^2$ and, therefore, do not result in difficulty in etching the polycrystalline silicon. In this etching the polycrystalline silicon is selectively removed in such a manner that the remaining portion has a cross sectional shape as shown in FIG. 6 and comprises flat conductor wire pattern 21$b$, 21$c$, $R_1$ and $R_2$ shown in FIG. 2. Subsequently, the first polycrystalline silicon layer 21 is subjected to oxidation in a furnace having an oxidizing atmosphere at a temperature of from 1000° to 1200° C. As a result, a relatively thin silicon dioxide film 40 having a thickness of from 100 to 2500 angstroms is formed on the first polycrystalline silicon layer 21. When the silicon dioxide film 40 is compared with the field oxide film 20, in this case the film 40 is relatively thin. However, since the silicon dioxide film electrically insulates the first and second polycrystalline silicon layers 21 and 24, respectively, the thickness of the film 40 should be 100 Å or more at the final production stage of the semiconductor device, so that the adjustment of its thickness can easily be carried out.

If a relatively thicker oxidation film 40 than discussed above is formed, say of about 2000 angstrom, the silicon nitride film 52 and the silicon dioxide film 51 are successively removed by etching solutions of the silicon nitride and silicon dioxide, respectively. During this removal, the relatively thicker silicon dioxide film 40 may be partly etched to leave a thickness suitable for insulation between the overlying and underlying layers. Since the silicon dioxide film 40 is present during the removal of the silicon nitride layer 52, the surface of the first polycrystalline silicon layer 21 is protected from damage caused by the etching solution of the silicon nitride.

Figure 7:
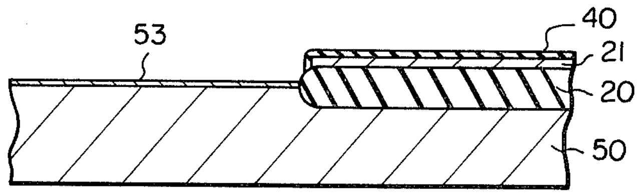
FIG. 7 is the cross sectional view, wherein a gate oxide film is formed on a portion of the substrate.

Referring to FIG. 7, a gate oxide film 53 is formed on the surface of the silicon substrate, from which the silicon dioxide film 51 and the silicon dioxide film 52 are removed. The gate oxide film 53, having a predetermined thickness, is formed by the thermal oxidation of the silicon substrate.

Figure 8:
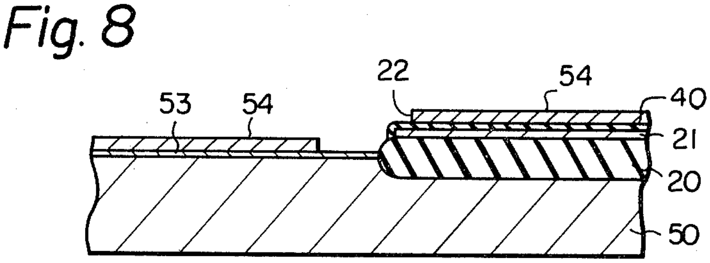
FIG. 8 is the cross sectional view, wherein a photoresist mask is formed for selectively etching the surface oxidation film and the gate oxide film.

Referring to FIG. 8, a photoresist layer 54 is selectively formed on the top surface of the silicon substrate 50, in such a manner that the window 22 is formed by the photoresist layer 54. An exposed portion of the silicon dioxide layer 53 and 40 in the window 22 is then removed. During this removal the thick field oxidation film 20 may be partly removed to a certain thickness. Although the field oxidation film 20 becomes thinner than the original thickness of the film 20 directly after its formation, the thickness reduction is not disadvantageous to the insulating characteristic of the film 20.

Figure 9:
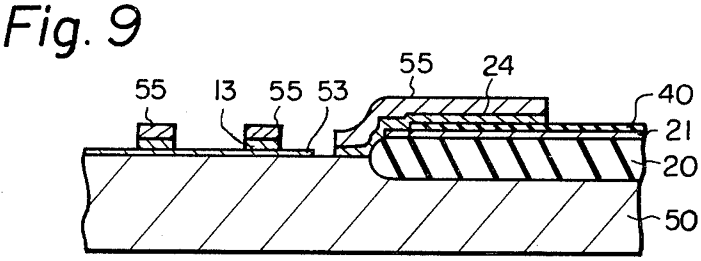
FIG. 9 is the cross sectional view, wherein a second polycrystalline film is formed to produce a gate electrode and a second conductor wire.

Referring to FIG. 9, the second polycrystalline silicon layer 24, containing a high content of an impurity such as phosphorus, is deposited by chemical vapor growth on the entire top surface of the silicon substrate 50, from which the photoresist layer 54 is removed beforehand. The second polycrystalline silicon layer 24 is then annealed at a temperature of from 900° to 1100° C. The sheet resistivity of the annealed silicon layer 24 is decreased to a value of about 30 MΩ/□. The thickness of the second polycrystalline silicon layer 24 is preferably from 3000 to 5000 Å.

The photoresist layer 55 is then formed on the substrate and thereafter selectively removed, so as to provide the layer 55 with a pattern of the word line 13, and the conductor wire patterns 24 and 25. By using the photoresist layer 55 for masking the second polycrystalline silicon layer, the exposed part of this layer is selectively removed and the masked parts of the second polycrystalline silicon layers 13, 24 (FIG. 9), and 25 (FIG. 4) are left. These layers 13, 24 and 25 are then used for masks of the gate oxide film 53 and silicon dioxide film 40, and the unmasked, exposed portion of these films 53 and 40 are removed by etching. Although during this etching the gate oxide film 53 under the film 13 is laterally etched to a length of approximately 1000 angstroms, such lateral etching, known in the semiconductor engineering as a "side etch", is not disadvantageous at all for producing a gate electrode having a width of 2 to 4 microns. After the removal of the photoresist layer 55, an ion implantation process is initiated to form the source and drain of the transistors and to increase conductivity of the various conductor wires.

Figure 10:
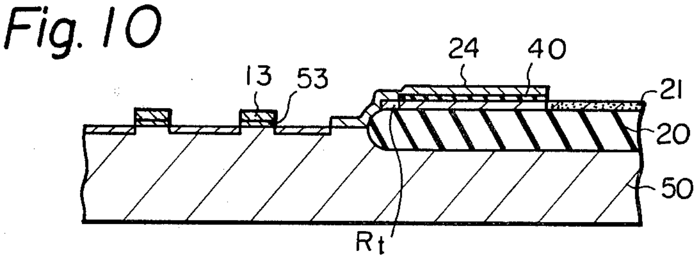
FIG. 10 is the cross sectional view, wherein an ion implantation is carried out to form several elements of an insulated gate semiconductor FET transistor.

Referring to FIG. 10, the second polycrystalline silicon layers 13 and 24 are used for a mask of the underlying layers during the ion implantation process. Arsenic is ion-implanted into the unmasked parts of the substrate. When the energy of ion implantation is 100 KeV, the projected range $R_p$ of the arsenic ion is 500 angstroms. Since the conductor wire 24 made from the second polycrystalline silicon layers has a thickness, for example 4000 angstroms, which is larger than the projected range, the arsenic ions are not implanted at all into the first polycrystalline silicon layer 21 under the second polycrystalline silicon layer 24. The high resistance of the first polycrystalline silicon layer 21 is therefore not reduced at all by the ion implantation.

After the ion implantation, the silicon substrate 50 is annealed at a temperature of from 90° to 1100° C., thereby redistributing the arsenic ions, which are present on the exposed, top surface of the P type silicon substrate. The PN junctions for the source and drain of the transistors can therefore be produced on the exposed top surface mentioned above. Simultaneously with the formation of the PN junctions, the impurity, which was ion-implanted in the bus line 21, the conductor wires 21$a$–21$d$, and the tip end $R_t$ of the resistor element $R_1$, is activated and reduces the resistance of these elements 21, 21$a$–21$d$ and $R_t$ to the low level required.

The silicon substrate 50 processed as mentioned above is finally subjected to the formation of an insulation film 39 of a phosphosilicate glass layer (FIGS. 3 and 4) on the entire top surface thereof. The windows 27, 34 and 37 are formed through the phosphosilicate glass layer 39, so as to connect the transistors $Q_3$ and $Q_4$ with the bit lines 11 and 12, respectively. Consequently, the semiconductor device having the cross sectional structure as shown in FIGS. 3 and 4 is completed.

Features of the process according to the present invention illustrated as shown in FIGS. 5 through 10 are as follows.

While the silicon nitride layer 52 (FIGS. 5 and 6) used for the selective oxidation of the field oxidation film 20 is not removed and hence remains, the surface of first polycrystalline silicon layer 21 is oxidized. If the surface of first polycrystalline silicon layer 21 is oxidized after the removal of the silicon nitride film 52, the portion of the silicon substrate 50, on which the gate is to be formed, is also oxidized during the formation of the oxide film 40. It is, therefore, necessary to perform an additional step of removing an oxidation film formed on the exposed substrate, prior to forming the gate oxide film 53 having a predetermined thickness.

In addition, when the relatively thicker oxidation film 40 (FIGS. 6 and 7), for example 2000 Å in thickness as discussed above, is formed in the initial production stage, the silicon substrate 50 can be dipped in an etching solution for the silicon nitride film 52 and the silicon dioxide film 51, without entirely removing the relatively thick oxidation film 40. Namely, after the removal of these films 51 and 52, the partly etched silicon dioxide film 40 still has a thickness for example of 1000 Å, which is suited for insulating between the overlying layer 24 and the underlying layer 21 (FIGS. 9 and 10).

The projected range Rp of an ion implantation as mentioned above may exceed the thickness of the silicon dioxide film 40 (e.g. 1000 angstroms). In the step of forming the source and drain regions of the transistors, and of providing the conductor wires with a high conductivity, the second polycrystalline silicon layer 24 (FIG. 10) masks the underlying, resistor element $R_1$. Such masking effect is advantageous when solid state diffusion occurs between the phosphosilicate glass layer 39 and the underlying layers. If the first and second, polycrystalline silicon layers 21 and 24, respectively, do not overlap, a trace amount of the arsenic ion is implanted into the silicon dioxide layer 40, with the result that the phosphosilicate in the layer 39 and the silicon dioxide in the layer 40 form a fusible composition during the solid state diffusion mentioned above. Such a fusible composition will lead to the disappearance of the masking function of the oxide layer 40. The overlapping structure between the resistor elements $R_1$ and $R_2$ having high resistance and the conductor wires 24 and 25 achieves not only to reduce the area of the memory cell but also to protect the oxide layer 40 from melting due to the solid diffusion.

The present invention will now be explained in further detail with reference to the following example.

EXAMPLE

The static random access memory as shown in FIGS. 1 and 2 was produced by the steps illustrated in FIGS. 5 through 10. The production conditions and the results were as follows.

A. Formation of Film for Preventing Oxidation (FIG. 5).

(1) Silicon substrate 50: P type conductivity with an impurity concentration of $10^{15}/cm^3$.

(2) Thermal oxidation of substrate 50. The substrate was heated at 1000° C. for 1 hour and the so formed silicon dioxide film 51 had a thickness of 500 Å.

(3) Deposition of the Silicon Nitride Layer. The silicon nitride layer was formed by the reaction of monosilane with ammonia and was 1000 Å thick.

B. Formation of Field Oxidation Film (FIG. 5).

The field oxidation film 20 of 6000 Å in thickness was formed by thermal oxidation at 900° C.

C. Formation of First Polycrystalline Silicon Layer (FIG. 6).

Monosilane was decomposed at 600° C. and the polycrystalline silicon was deposited as the layer 21 having a thickness 4000 Å. The arsenic was ion-implanted at a concentration of $10^{12}/cm^2$.

D. Formation of Oxide Layer on the First Polycrystalline Silicon Layer (FIG. 6).

The silicon dioxide layer 40, 2000 Å in thickness, was formed by the oxidation of the polycrystalline silicon layer 21 at 1100° C. The silicon nitride film 52 was removed by dipping the entire substrate in a phosphoric acid solution, and then, the silicon dioxide film 51 was removed by dipping the entire substrate in a fluoric acid solution. The silicon dioxide layer 40, had a thickness of 1000 Å after the dipping mentioned above.

E. Formation of Gate Oxidation Film (FIG. 7).

The gate oxidation film 53 was formed by thermal oxidation to a thickness of 400 Å.

F. Selective Removal of Silicon Dioxide Films 40 and 53 (FIG. 8).

The films 40 and 53 were selectively etched by a fluoric acid solution.

G. Formation of Second Polycrystalline Silicon Layers 13 and 24 (FIG. 9).

The second polycrystalline silicon layers having a dopant (impurity) of phosphorus and being deposited by a chemical vapor growth had a thickness of 4000 Å. The sheet resistivity of the polycrystalline silicon layer 24 directly after the deposition amounted to a surface resistance of 100Ω/□ and was reduced to 30Ω/□ by annealing at 1050° C. Photolithography was used to form a circuit pattern as shown in FIG. 9. The width of the gate electrode was 3μ.

H. Ion Implantation (FIG. 10)

Arsenic ions were ion-implanted at an energy of 100 KeV and then the substrate 50 so treated was annealed at 1050° C. A phosphosilicate glass layer 39 was deposited on the entire top surface of the silicon substrate 50, and was then subjected to the formation of the windows 27, 34 and 37.

Although embodiments of the present invention have been explained in detail with reference to FIGS. 1 through 10, the present invention is not limited to these embodiments, and various modifications to these embodiments may be made within the scope of the appended claims.

What we claim is:

1. An integrated semiconductor circuit device comprising:

a semiconductor substrate having impurity regions for at least one active element including a respective insulated gate on said substrate;

a field insulating film selectively covering the surface of said semiconductor substrate to at least partly define each said active element;

a first polycrystalline semiconductor material layer selectively covering said field insulating film and having a shape and impurity level in respective portions to form at least one resistor element extending in a respective predetermined direction with a conductor portion at each end of each said resistor element;

a further insulating film covering each said resistor element; and a second polycrystalline semiconductor material layer having a respective portion completely covering said second insulating film over each said resistor element and in electrical contact with the conductor portion at a first end of each resistor element, each said portion of the second polycrystalline material layer that covers over a respective resistor element providing a conductor pattern from said first end of each said resistor element selectively to said at least one active element of said device, and each said portion of said second polycrystalline layer covering a respective resistor element terminating at the other end of the respective resistor element, and said second polycrystalline material layer further comprising the gate electrode of said respective gate of each said active element.

2. A semiconductor device according to claim 1, each said active element and the respective gate comprising an insulated gate semiconductor FET, and said conductor pattern of said second polycrystalline layer comprising means for connecting each said resistor element to the drain of a respective insulated gate semiconductor FET as a load resistance.

3. A semiconductor device according to claim 2, said first polycrystalline semiconductor layer comprising at least one bus line for connection to a power source and a respective conducting path(s) for connecting each said bus line selectively to each said resistor element, said bus line and said conducting path(s) of said first polycrystalline semiconductor layer being integrally formed in said semiconductor device.

4. A semiconductor device according to claim 3, comprising at least at least one pair of said insulated gate semiconductor FETs and one of said resistor elements corresponding to each said FET, and said conductor paths of said second polycrystalline semiconductor material layer comprising means for connecting the gate of each FET with the drain of the other FET of the same said pair of FETs.

5. A semiconductor device according to claim 4, said conducting paths of said second polycrystalline semiconductor material layer comprising at least one conducting piece of essentially convex shape in plan view with a protruding part and a base part and a corresponding conducting piece of essentially concave shape in plan view with a respective base part and two protruding parts corresponding to each said pair of said insulated gate semiconductor FETs, each of said convex and concave pieces covering a respective one of said resistor elements, with the protruding part of said convex portion including a gate electrode of one of said insulated gate semiconductor FETs of the respective pair, and the base part thereof covering the underlying resistor element and electrically connecting the gate of said one insulated gate semiconductor FET with the drain of the other insulated gate semiconductor FET of the respective pair, and the base part of the concave piece covering the respective underlying resistor element and electrically connecting the respective two protruding parts with one another, one of said protruding parts comprising a gate electrode of said other insulated gate semiconductor FET and the other of said protruding parts comprising a drain electrode of said one insulated gate semiconductor FET, of each respective pair of said FETs.

6. A semiconductor device according to claim 5, said convex and concave pieces of said second polycrystalline semiconductor material layer(s) comprising an arrangement in which said protruding part of said convex piece projects in plan view into the concavity of said concave piece.

7. A semiconductor device according to claim 3 or 6, said device comprising a second pair of said insulated gate semiconductor FETs, one of the source and drain regions of each said second pair of the insulated gate semiconductor FETs being selectively connected to a respective one of said resistor elements by a respective portion of said second polycrystalline semiconductor material layer.

* * * * *

UNITED STATES PATENT AND TRADEMARK OFFICE
CERTIFICATE OF CORRECTION

PATENT NO. : 4,326,213

DATED : April 20, 1982

INVENTOR(S) : Shirai et al

It is certified that error appears in the above—identified patent and that said Letters Patent is hereby corrected as shown below:

Front page, between "[22]" and "[51]", insert:
--[30] Foreign Application Priority Data
Dec. 1, 1977 [JP] Japan.........52-144335--.
Column 2, line 51, after "substrate" insert --;--.
Column 3, line 1, delete "to".
Column 4, line 31, "wire, and;" should be --wire; and--.
Column 6, line 33, "transistor" should be --transistors--.
Column 7, line 14, " "38 " should be --38--;
line 33, delete ",";
line 34, after "cell" insert --,--.
Column 8, line 1, after "3" insert --defines--.
Column 9, line 38, "anstrom" should be --angstroms--.
Column 10, line 45, "90°" should be --900°--.
Column 13, line 35, delete the first occurrence of "at least".

Signed and Sealed this

*Twenty-fourth* Day of *August 1982*

[SEAL]

*Attest:*

GERALD J. MOSSINGHOFF

*Attesting Officer* — *Commissioner of Patents and Trademarks*